United States Patent
Juntwait

(10) Patent No.: US 7,001,212 B1
(45) Date of Patent: Feb. 21, 2006

(54) SURFACE MOUNTABLE RETENTION BRACKET FOR ELECTRICAL CONNECTOR

(75) Inventor: Eric Juntwait, Hummelstown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/040,440

(22) Filed: Jan. 21, 2005

(51) Int. Cl.
    *H01R 13/73* (2006.01)
(52) U.S. Cl. .................... 439/566; 439/570
(58) Field of Classification Search ........... 439/566, 439/570, 562, 563, 571, 83
    See application file for complete search history.

(56) References Cited

U.S. PATENT DOCUMENTS

| | | | | |
|---|---|---|---|---|
| 5,120,256 A | * | 6/1992 | Walden | 439/553 |
| 5,259,789 A | * | 11/1993 | Patel et al. | 439/570 |
| 5,297,966 A | * | 3/1994 | Brennian et al. | 439/64 |
| 5,318,464 A | * | 6/1994 | DiMondi et al. | 439/553 |
| 5,630,730 A | * | 5/1997 | Wang et al. | 439/567 |
| 5,704,807 A | * | 1/1998 | Sherman et al. | 439/570 |
| 6,089,883 A | * | 7/2000 | McHugh et al. | 439/108 |
| 6,254,429 B1 | * | 7/2001 | Morita | 439/570 |
| 6,361,332 B1 | * | 3/2002 | Froude et al. | 439/83 |
| 6,475,031 B1 | * | 11/2002 | Wu | 439/570 |
| 6,478,617 B1 | * | 11/2002 | Fan | 439/570 |
| 6,645,005 B1 | * | 11/2003 | Wu | 439/563 |

* cited by examiner

*Primary Examiner*—Gary Paumen
*Assistant Examiner*—Phuongchi Nguyen
(74) *Attorney, Agent, or Firm*—Wei Te Chung

(57) ABSTRACT

A surface mountable retention bracket (40) for an electrical connector (1) having a housing (10) with outwardly extending mounting flanges (12) along a mounting face (102) thereof, each flange including two vertical enclosed channels (14) extending therethrough to the mounting face with a partition (15) therebetween, the channels being interconnected by a slot (16) undercutting the partition. The retention bracket includes a base (42) retained in the slot, a pair of mounting legs (43) extending through the channels and beyond the mounting face so as to be soldered onto a printed circuit board, and a retention tab (44) inserted into a recess (17) defined in the partition.

7 Claims, 7 Drawing Sheets

SURFACE MOUNTABLE RETENTION BRACKET FOR ELECTRICAL CONNECTOR

BACKGROUND OF THE INVENTION

1. Field of the Invention

The present invention generally relates to an electrical connector, and more particularly to a retention bracket for an electrical connector adapted to be mounted on a surface of a printed circuit board.

2. Description of Related Art

When surface mounting electrical connectors to printed circuit boards, the increased miniaturization of the connectors and increased density of the terminals therein require that the connector housing be secured to the printed circuit board to provide strain relief for the multiple soldered terminal connections.

U.S. Pat. No. 5,120,256 discloses a retention system 10 (as shown in FIG. 4 of this patent) for retaining a connector, housing 12 to the surface 14 of a substrate 16. Referring to FIG. 2 of this patent, the retention system 10 includes a pair of arms 50A, 50B extending from one endwall 40 of the housing and each having a slot 52A, 52B therein, a wedge-shaped abutment member 60 disposed on the endwall 40 intermediate the arms 50A, 50B, an L-shaped resilient retaining clip 80 having a base leg 82, a latching leg 84 and an opening 90 formed therein. In assembly, the retaining clip 80 is inserted to the endwall 40 from a bottom side of the housing 12 with opposite side edges of the latching leg 84 being received in the slots 52A, 52B and the abutment member 60 bearing against the opening 90. However, when the electrical connector disengages from a complementary connector, it is inevitable that the housing will suffer from external force in all directions, so it is highly required to the retention force between the latching leg of the retaining clip and the slot of the arm of the housing, and the withstanding force of the abutment member since the retaining clip is assembled from the bottom side of the housing. If the retention force and the withstanding force is not enough strong, the retaining clip won't work well as a strain relief.

U.S. Pat. No. 5,704,807 discloses another retention bracket 40 (as shown in FIG. 2 of this patent) attached to a mounting flange 22 extending outwardly from one end of the housing 12 from a top side of the housing. The mounting flange 22 defines a pair of channels 26 extending therethrough. The channels are spaced apart by a retention tab 28 having a vertical neck between the channels and extending outwardly to an enlarged end portion. The retention bracket 40 includes a base 42 having a pair of struts 44 extending upwardly to a body section 46 defining therebetween an aperture 48 for receiving the retention tab 28. An outer wall 24 of the housing includes opening 30 therein which extend into the respective channels for allowing the struts 48 to pass therethrough. The aperture 48 has a wide horizontal portion adjacent the base 42 for permitting passage of the enlarged end portion therethrough and a narrow vertical portion along the body section 46 for receiving the neck of the retention tab. However, the retention bracket is more complex in structure and is difficult to be manufactured. Furthermore, the outer wall of the mounting flange is thinner since the electrical connector is small in size, and the pair of opening is defined in the outer wall, so opposite sides of the enlarged end portion is easily subject to rupture when an external force is exerted on the enlarged end portion.

Hence, it is desired to provide an electrical connector with a simple and improved retention bracket which can effectively resist a withdrawing force to ensure proper electrical connection between terminals of the connector and a printed circuit board.

SUMMARY OF THE INVENTION

An object of the present invention is to provide an improved retention bracket for a surface mountable electrical connector adapted to be mounted on the surface of a printed circuit board.

In order to achieve the object set forth, a surface mountable header connector in accordance with the present invention comprises an insulative housing with outwardly extending mounting flanges along a mounting face thereof, a plurality of terminals received in the housing and including surface mountable contact portions extending outwardly along the mounting face, and a pair of surface mountable retention brackets positioned within the respective mounting flanges. Each mounting flange comprises two vertical enclosed channels extending therethrough to the mounting face with a partition therebetween. The channels are interconnected by a slot undercutting the partition. The partition defines a recess therein extending through the mounting face. Each retention bracket comprises a base retained in the slot, a pair of mounting legs each having a surface mountable foot extending through the channels and beyond the mounting face, and a retention tab extending from the base intermediate the mounting legs and inserted in the recess.

Other objects, advantages and novel features of the invention will become more apparent from the following detailed description when taken in conjunction with the accompanying drawings.

DETAILED DESCRIPTION OF THE INVENTION

Figure 1:
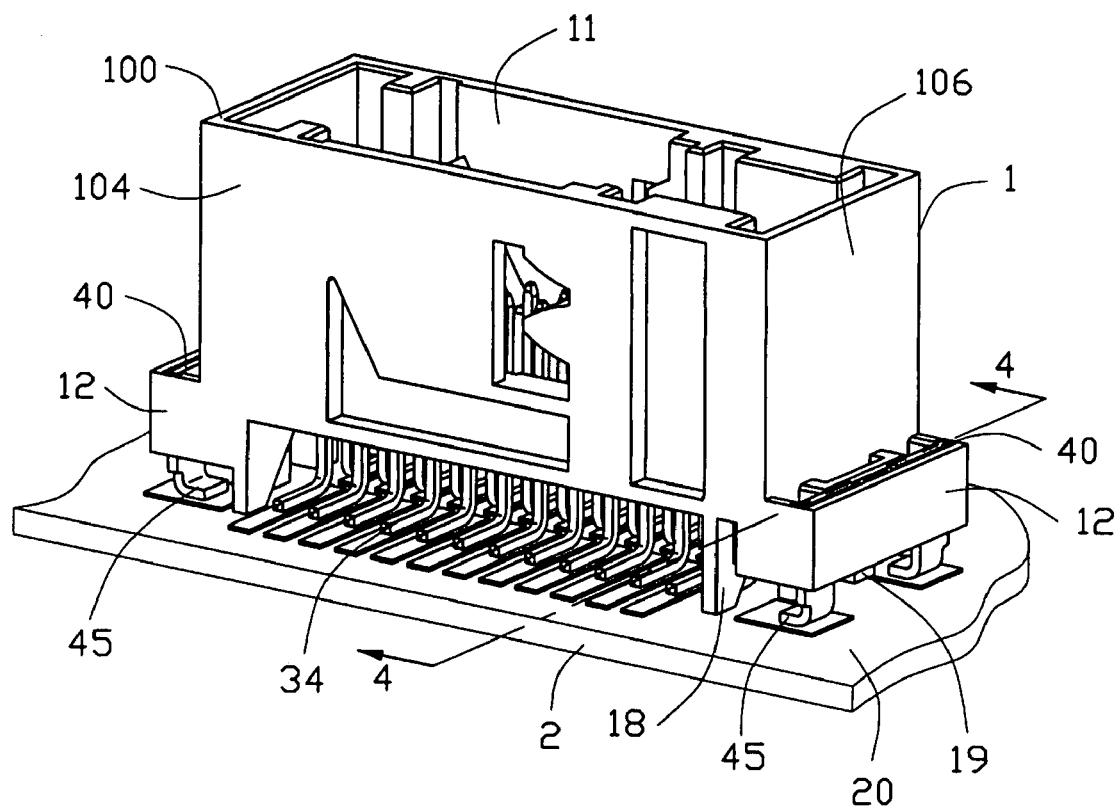
FIG. 1 is a perspective view of a surface mountable header connector in accordance with a first embodiment of the present invention mounted to a printed circuit board.
Figure 2:
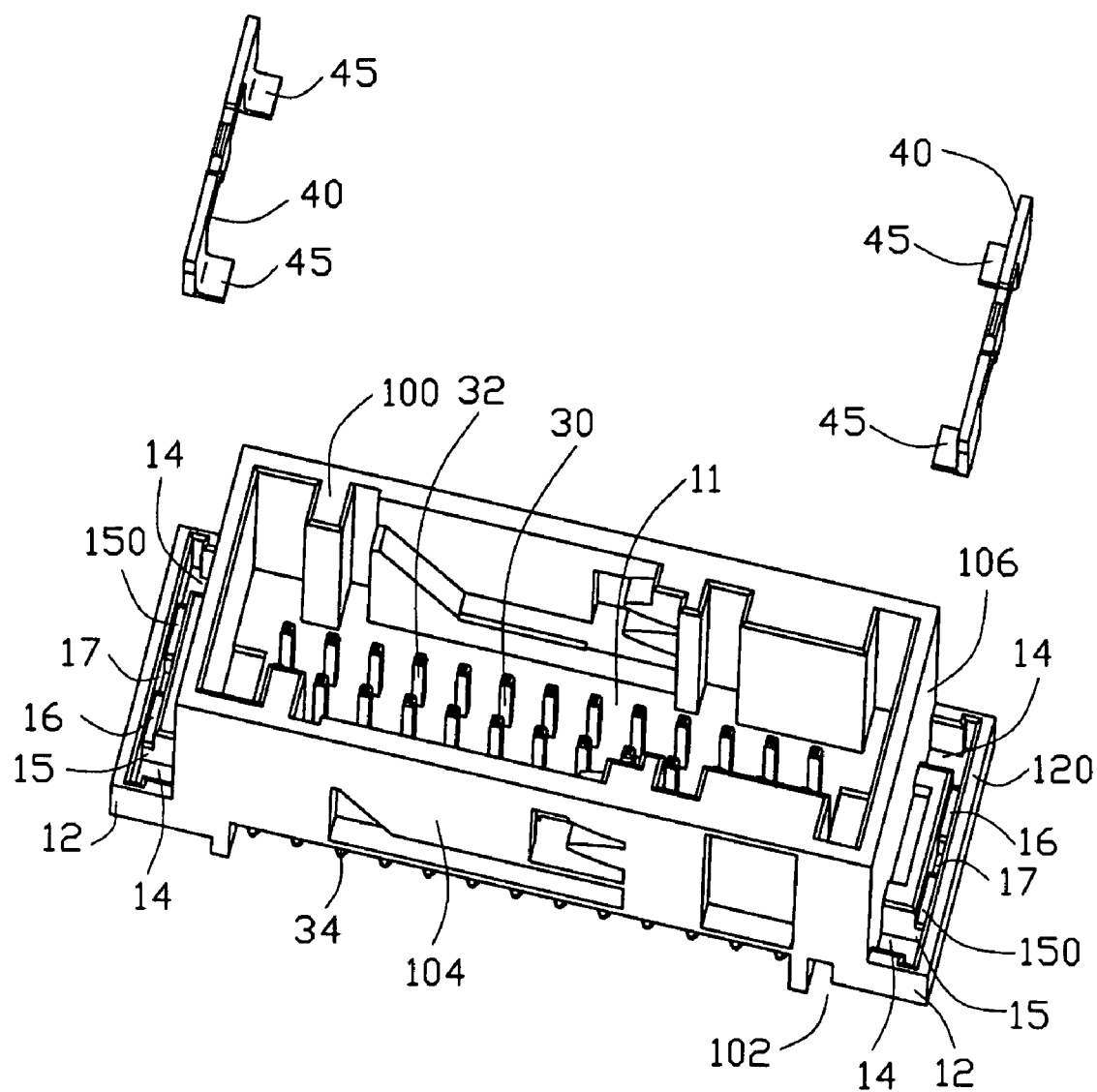
FIG. 2 is a perspective view of the header connector of FIG. 1 with a retention bracket being exploded from a mounting flange of the header connector.

Reference will now be made in detail to the preferred embodiment of the present invention.

For purpose of illustrating the invention the surface mountable retention bracket is shown being used to mount a header connector having surface mount terminals therein. Referring now to FIGS. 1 through 5, a surface mountable header connector 1 in accordance with the present invention comprises an insulative housing 10, a plurality of conductive terminals 30 arranged in two rows, and a pair of retention brackets 40 attached to the insulative housing 10 for retaining the header connector 1 onto a surface 20 of a printed circuit board (PCB) 2.

The insulative housing 10 has a mating face 100, a mounting face 102 opposite to the mating face 100, opposed sidewalls 104, and opposed endwalls 106 connecting with the sidewalls 104. The housing defines a receptacle 11 in the mating face 100 for receiving a corresponding portion of a complementary connector (not shown) and has a pair of mounting flange 12 extending outwardly from the respective endwalls 106 along the mounting face 102. Each mounting flange 12 includes a pair of vertical enclosed channels 14 extending from a top surface 120 thereof to the mounting face 102 of the housing 10 and spaced apart by a partition 15. The channels 14 are interconnected by a slot 16 undercutting the partition 15. The partition 15 has an upper surface 150 and defines a recess 17 therein extending through the mounting face 102. The housing 10 has four supporting posts 18 disposed at four corners thereof and two pairs of standoffs 19 in opposite ends thereof extending from the mounting face 102 together for supporting the housing 10 on the surface 20 of the PCB 2.

Each terminal 30 has a mating section 32 exposed in the receptacle 11 for mating with a corresponding contact of the complementary connector and a surface mount contact section 34 extending at an right angle to the mating section 32.

Figure 3:
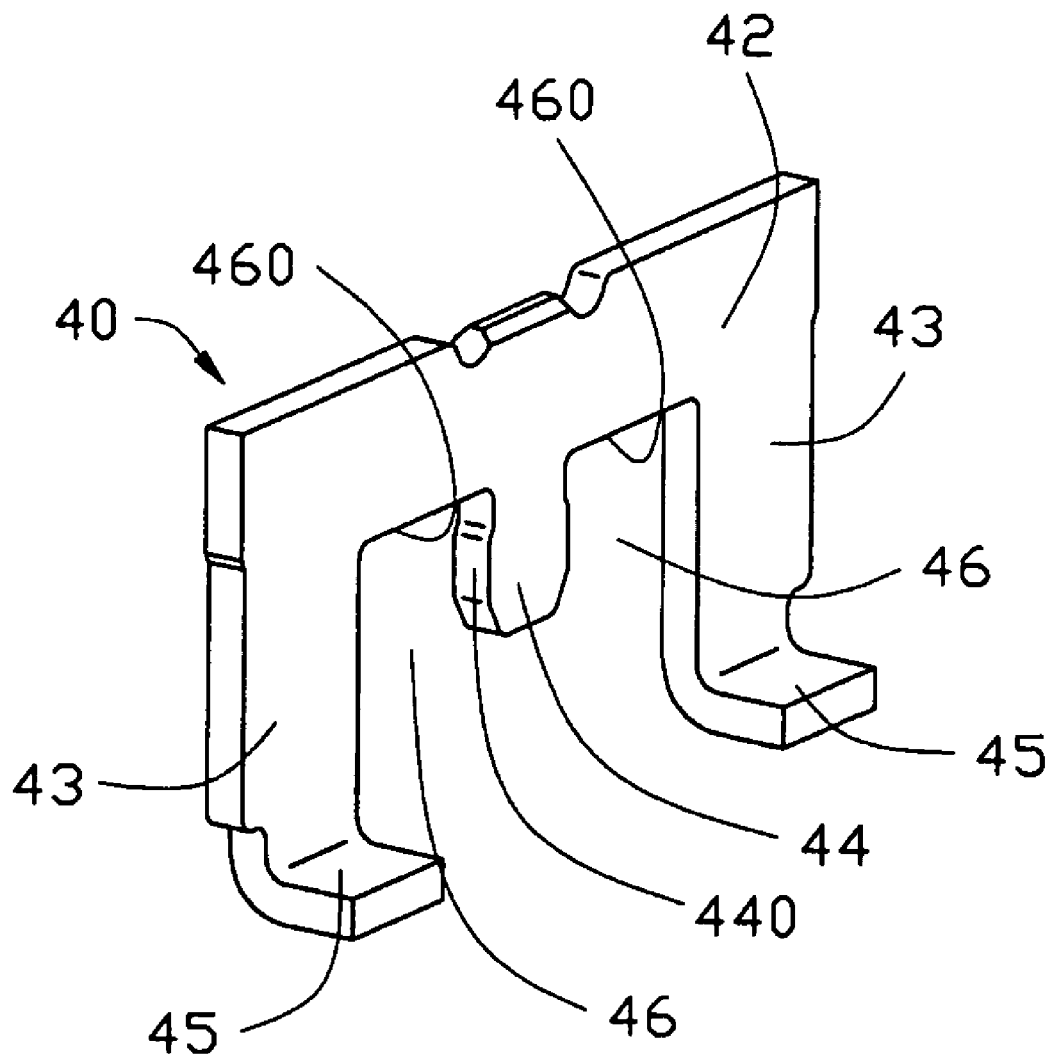
FIG. 3 is a perspective view of the retention bracket in accordance with a first embodiment of the present invention.

Especially referring to FIG. 3, the retention bracket 40 has a generally reversed U-shaped configuration and includes a vertical base 42 having opposed long sides and opposed short sides, a pair of mounting legs 43 extending downwardly from opposite sides of a lower long side of the base 42, and a retention tab 44 extending downwardly from the lower long side of the base 42 intermediate the pair of mounting legs 43. The width dimension of the shorter side of the base 42 is generally equal to the depth of the slot 16 of the mounting flange 12. Each mounting leg 43 has a surface mountable foot 45 bent 90 degrees in a horizontal direction from a distal end thereof. The retention tab 44 has retention protrusions 440 in opposite sides thereof dimensioned to engage the recess 17 in an interference fit for securing the retention bracket 40 to the mounting flange 12 of the housing 10. A cutout 46 is formed between the mounting leg 43 and the retention tab 44. The base 42 has a stop surface 460 within the cutout 46 engageable with the upper surface 150 of the partition 15 to provide mechanical support to hold the housing 10 to the PCB 2 when the header connector 1 is unmated from the complementary connector.

In assembly, the terminals 30 are inserted into the housing 10 from the mounting face 102. The retention brackets 40 are assembled to the mounting flanges 12 of the housing 10 from the top surface 120 of the mounting flange 12. The mounting legs 14 extend into the channels 14 with the surface mountable feet 45 thereof extending through the channels 14 and beyond the mounting face 102, and the retention tab 48 is embedded into the recess 18. When the base 42 is fully received in the slot 16 and embraces the partition 15 with the stop surface 460 of the base 42 engages with the upper surface 150 of the partition 15, the retention brackets 40 are securely positioned within the respective mounting flanges 12.

Figure 4:
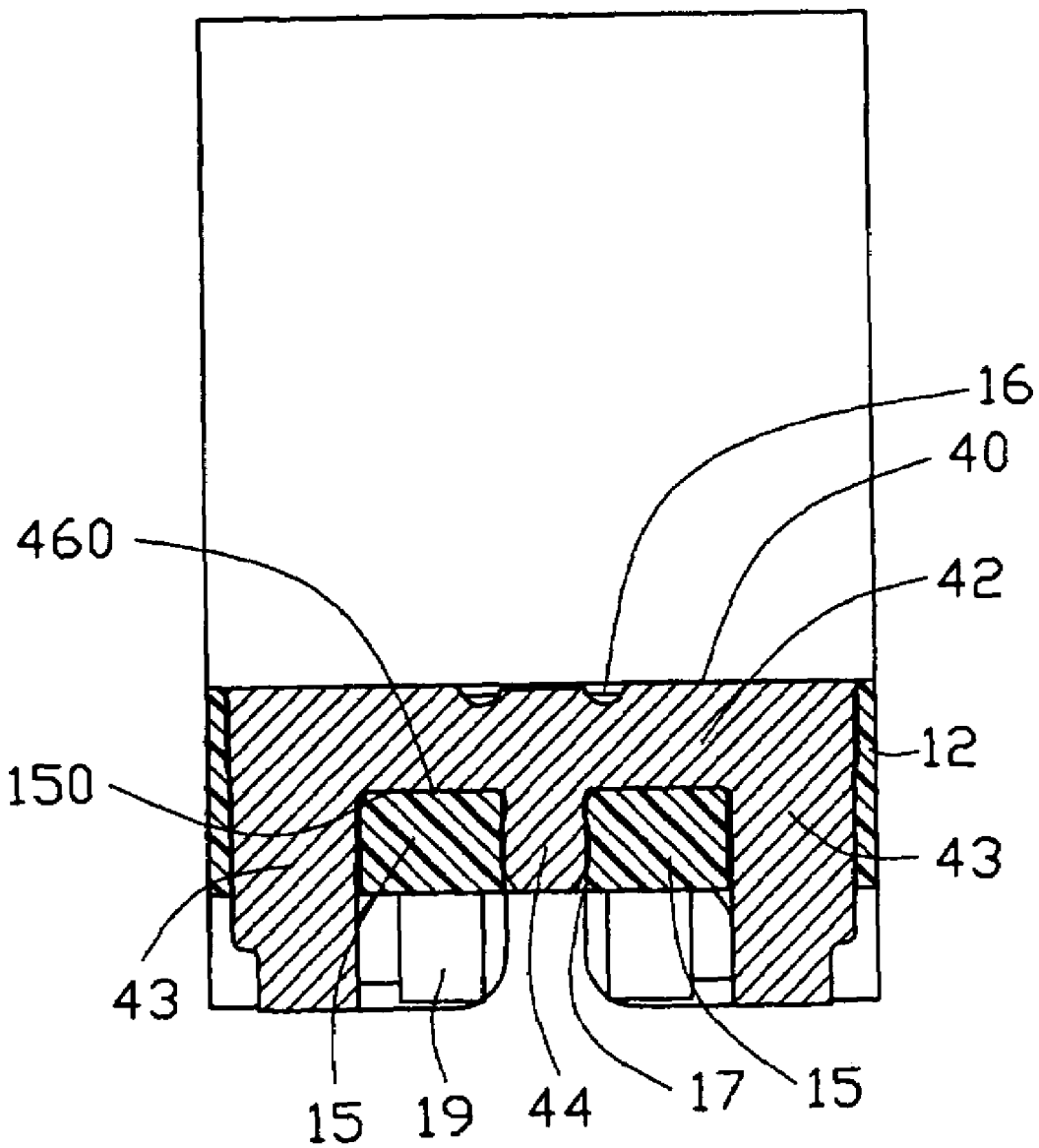
FIG. 4 is a cross-sectional view of the header connector taken along line 4—4 of FIG. 1, with the retention bracket fully secured in the mounting flange of the electrical connector.
Figure 5:
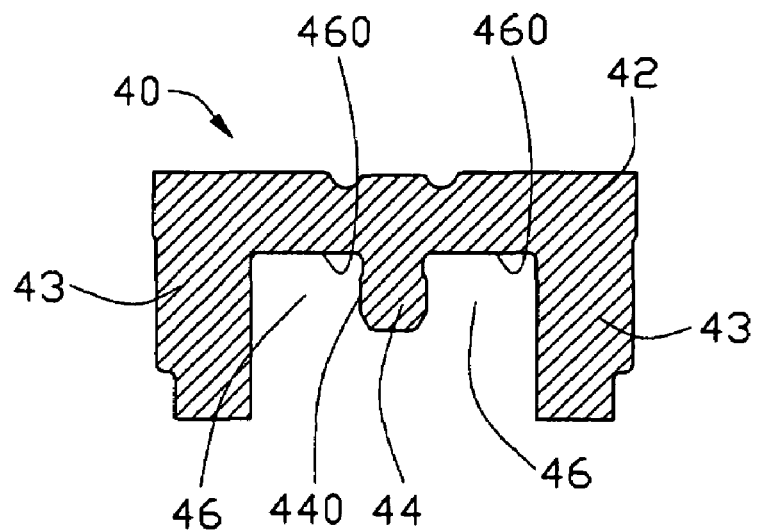
FIG. 5 is a view similar to FIG. 3, with the retention bracket exploded from the mounting flange of the electrical connector.
Figure 5:
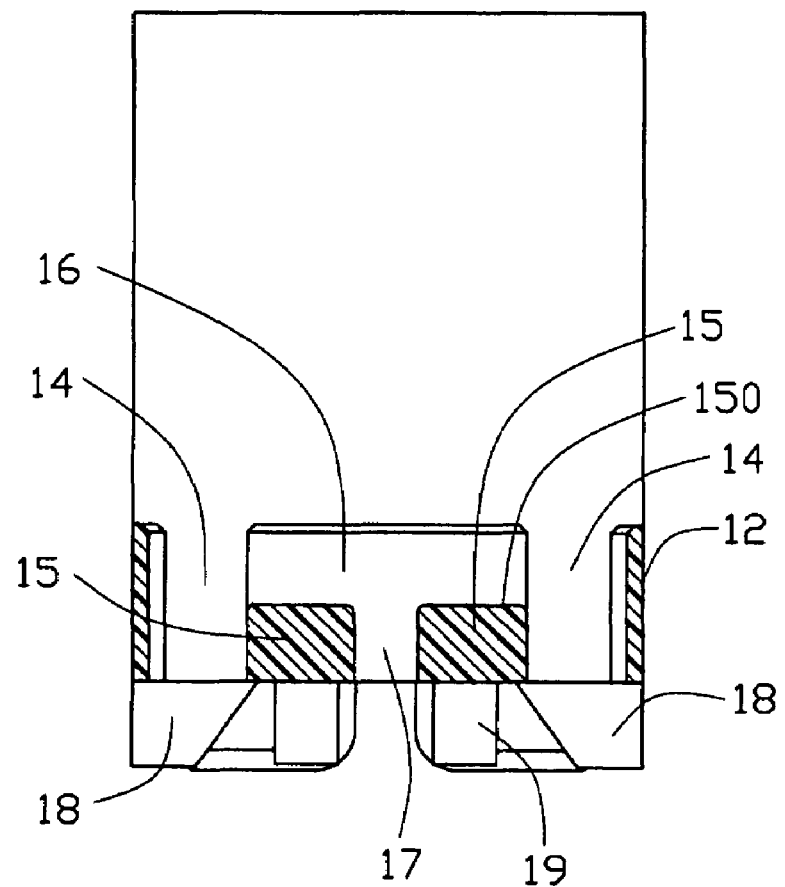

As shown in FIG. 4, when fully assembled, even if the housing is pulled in various directions by the complementary connector, the retention bracket can be supported and restricted in the housing by inner and outer walls of the mounting flange so that the housing 10 cannot be pulled away from the retention bracket 40 when the retention bracket 40 are fully secured by soldering to the PCB 2. Therefore, the retention bracket 40 can provide good strain relief for the surface mountable header connector 1.

Figure 6:
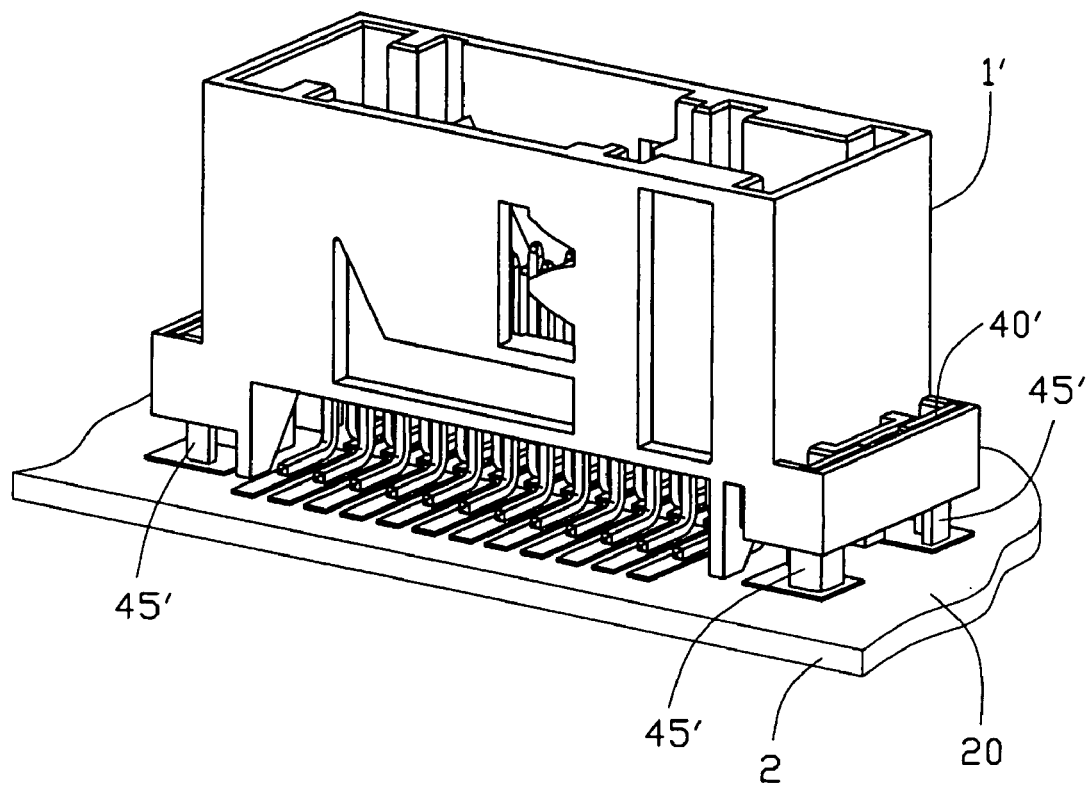
FIG. 6 is a perspective view of a surface mountable electrical connector in accordance with a second embodiment of the present invention mounted to a printed circuit board.
Figure 7:
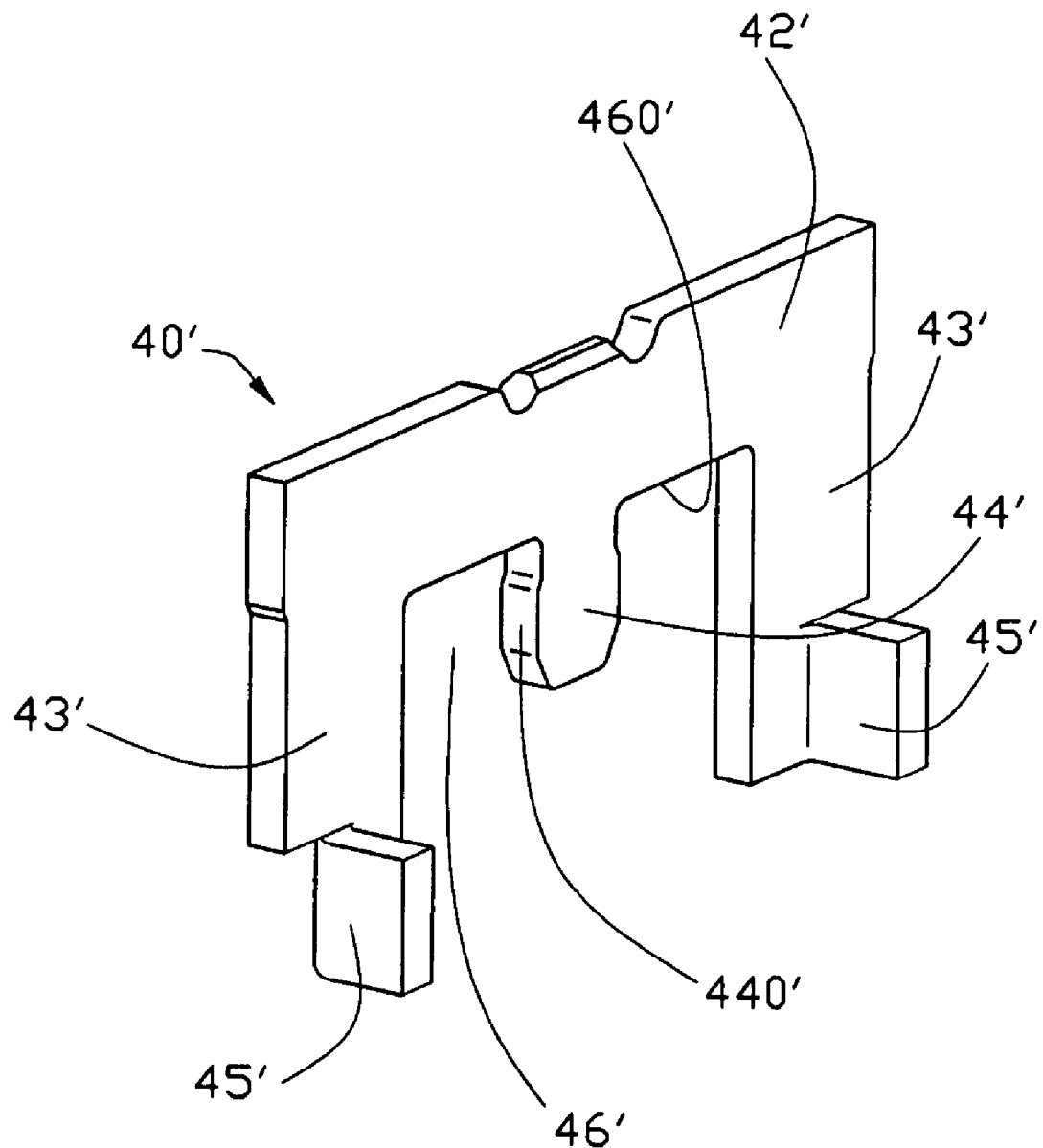
FIG. 7 is a perspective view of a retention bracket in accordance with a second embodiment of the present invention.

FIGS. 6 and 7 discloses an electrical connector 1' in accordance with a second embodiment of the present invention. The electrical connector 1' discloses a second embodiment of the retention bracket 40' having a surface mountable foot 49' different from that of the first embodiment. One side edge of the surface mountable foot 49' is bent 90 degrees in a vertical direction, thereby forming an L-shaped contact surface for engaging with the surface 20 of the PCB 2. Similarly, the retention bracket 40 can perform very well.

As can be seen from FIGS. 1 and 6, the retention bracket 40, 40' of the present invention is configured to provide a relatively large surface area for securing to the PCB. However, the retention bracket of the present invention is not limited to the embodiments given above. The retention bracket can be a straight retention bracket, but in comparison with the foregoing brackets, the straight retention bracket need to have a large thickness so that the surface mountable foot still has a relatively large surface area.

It is thought that the retention bracket of the present invention and many of its attendant advantages will be understood from the foregoing description. It is apparent that various exchanges may be made in the form, construction, and arrangement of parts thereof without departing from the spirit or scope of the invention, or sacrificing all of its material advantages.

What is claimed is:

1. A surface mountable retention bracket for use in an electrical connector having a housing with outwardly extending mounting flanges along a mounting face thereof, each said flange including two vertical enclosed channels extending therethrough to said mounting face with a partition therebetween, said channels being interconnected by a slot undercutting the partition, said retention bracket comprising:

a retention bracket has a generally reversed U-shaped configuration and includes a vertical base having opposed long sides and opposed short sides, pair of mounting legs extending downwardly from opposite sides of a lower long side of the base, and a retention tab extending downwardly from said lower long side of said base intermediate said pair of mounting legs, said retention tab is located on a same plane with said base and said pair of mounting legs;

said base retained in the slot and said pair of mounting legs extending through the channels and beyond said mounting face so as to be soldered onto a printed circuit board;

said retention bracket further includes a retention tab inserted into a recess defined in the partition;

said retention tab has at least one retention protrusion in opposite sides thereof for securing said retention bracket to said mounting flange of the housing;

said base has a stop surface within a cutout formed between each mounting leg and the retention tab engageable with an upper surface of said partition to provide mechanical support to hold said housing to a printed circuit board when the connector is unmated from a complementary connector.

2. The surface mountable retention bracket as recited in claim 1, wherein said mounting leg has a surface mountable foot bent 90 degrees in a horizontal direction.

3. The surface mountable retention bracket as recited in claim 1, wherein said mounting leg has a surface mountable foot whose side edge is bent 90 degrees in a vertical direction.

4. A surface mountable electrical connector comprising:
- an insulative housing having a mounting face and mounting flanges extending outwardly along the mounting face, each said mounting flange including two vertical enclosed channels extending vertically therethrough to said mounting face with a partition therebetween, said channels being interconnected by a slot undercutting the partition;
- a plurality of terminals received in said housing and including surface mountable contact portions extending outwardly along said mounting face; and
- a pair of surface mountable retention bracket adapted to be inserted into the respective mounting flanges from a top surface thereof, and said retention bracket has a generally reversed U-shaped configuration and includes a vertical base having opposed long sides and opposed short sides, pair of mounting legs extending downwardly from opposite sides of a lower long side of said base, and a retention tab extending downwardly from said lower long side of said base intermediate said pair of mounting legs, said retention tab is located on a same plane with said base and said pair of mounting legs;
- each bracket including said base positioned in said slot and embracing the partition, and said pair of mounting legs extending through said channels and beyond said mounting face;
- said partition defines a recess therein and wherein said retention bracket includes said retention tab embedded into said recess for securing said retention bracket to said mounting flange of said housing;
- said base has a stop surface formed between said mounting leg and said retention tab engageable with an upper surface of said partition.

5. The electrical connector as recited in claim 4, wherein said mounting leg has a surface mountable foot bent 90 degrees in a horizontal direction.

6. The electrical connector as recited in claim 4, wherein said mounting leg has a surface mountable foot whose side edge is bent 90 degrees in a vertical direction.

7. An electrical connector assembly comprising:
- a printed circuit board; a connector mounted upon said printed circuit board, said connector including an insulative housing having a main body extending along a lengthwise direction and defining an upward mating cavity therein, and a pair of mounting flanges located by two ends of the main body in said lengthwise direction, each of said mounting flanges defining a retention section and a pair of through channels, which vertically extend through the corresponding mounting flange, located by two sides of said retention section in a transverse direction perpendicular to said lengthwise direction, both said retention section and said pair of through channels protectively located behind an end face of the mounting flange in said lengthwise direction; and a pair of surface mountable retention brackets downwardly assembled into the corresponding mounting flanges, respectively;
- a retention bracket has a generally reversed U-shaped configuration and includes a vertical base having opposed long sides and opposed short sides, pair of mounting legs extending downwardly from opposite sides of a lower long side of the base, and a retention tab extending downwardly from said lower long side of said base intermediate said pair of mounting legs, said retention tab is located on a same plane with said base and said pair of mounting legs;
- each of said brackets includes said retention tab secured to said retention section of said corresponding mounting flange, and said pair of mounting legs respectively extending through said corresponding through channels of said mounting flange and surface mounted to said printed circuit board;
- each of said through channels is isolated from an exterior in said lengthwise direction by the corresponding end face.

* * * * *